US009679888B1

(12) United States Patent
Lee et al.

(10) Patent No.: US 9,679,888 B1
(45) Date of Patent: Jun. 13, 2017

(54) ESD DEVICE FOR A SEMICONDUCTOR STRUCTURE

(71) Applicant: GLOBALFOUNDRIES Inc., Grand Cayman (KY)

(72) Inventors: Chien-Hsin Lee, Malta, NY (US); Mahadeva Iyer Natarajan, Clifton Park, NY (US); Manjunatha Prabhu, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/251,632

(22) Filed: Aug. 30, 2016

(51) Int. Cl.
*H01L 27/02* (2006.01)
*H01L 27/06* (2006.01)
*H01L 23/528* (2006.01)

(52) U.S. Cl.
CPC ...... *H01L 27/0266* (2013.01); *H01L 23/5286* (2013.01); *H01L 27/0262* (2013.01); *H01L 27/0288* (2013.01); *H01L 27/0292* (2013.01); *H01L 27/0623* (2013.01)

(58) Field of Classification Search
None
See application file for complete search history.

(56) References Cited

U.S. PATENT DOCUMENTS

| | | | | |
|---|---|---|---|---|
| 6,309,940 B1 * | 10/2001 | Lee | ............ | H01L 27/0921 257/372 |
| 6,850,397 B2 * | 2/2005 | Russ | ............ | H01L 29/87 257/173 |
| 8,252,642 B2 * | 8/2012 | Morris | ............ | H01L 29/1087 257/E29.064 |
| 2007/0121381 A1 * | 5/2007 | Kalnitsky | ............ | G11C 16/0433 365/185.18 |
| 2007/0262386 A1 * | 11/2007 | Gossner | ............ | H01L 27/0262 257/355 |
| 2010/0207163 A1 * | 8/2010 | Yabu | ............ | H01L 27/0262 257/173 |
| 2012/0319164 A1 * | 12/2012 | Inaba | ............ | H01L 29/66393 257/173 |
| 2014/0027811 A1 * | 1/2014 | Chen | ............ | H01L 29/7436 257/137 |
| 2015/0091054 A1 * | 4/2015 | Su | ............ | H01L 27/0248 257/140 |
| 2015/0123184 A1 * | 5/2015 | Wang | ............ | H01L 27/0925 257/315 |

(Continued)

*Primary Examiner* — Michael Lebentritt
*Assistant Examiner* — Jordan Klein
(74) *Attorney, Agent, or Firm* — Heslin Rothenberg Farley & Mesiti P.C.

(57) ABSTRACT

An electrostatic discharge (ESD) device for an integrated circuit includes a substrate having a longitudinally extending fin dispose thereon. A first n-type FinFET (NFET) is disposed within the fin. The NFET includes an n-type source, an n-type drain and a p-well disposed within the substrate under the source and drain. A p-type FinFET (PFET) is disposed within the fin. The PFET includes a p-type source/drain region and an n-well disposed within the substrate under the source/drain region. The n-well and p-well are located proximate enough to each other to form an np junction therebetween. The p-type source/drain region of the PFET and the n-type drain of the NFET are electrically connected to a common input node.

20 Claims, 9 Drawing Sheets

(56) References Cited

U.S. PATENT DOCUMENTS

| | | | |
|---|---|---|---|
| 2015/0194419 A1* | 7/2015 | Singh | H01L 29/41708 257/173 |
| 2016/0056146 A1* | 2/2016 | Li | H01L 27/0259 257/133 |
| 2016/0056147 A1* | 2/2016 | Li | H01L 27/0262 257/173 |

* cited by examiner

ESD DEVICE FOR A SEMICONDUCTOR STRUCTURE

TECHNICAL FIELD

The present invention relates to electrostatic discharge (ESD) protection for semiconductor structures. More specifically, the invention relates to an ESD device for a FinFET semiconductor structure having a silicon-controlled rectifier (SCR) in parallel with an NPN transistor.

BACKGROUND

With constant down-scaling and increasingly demanding requirements to the speed and functionality of ultra-high density integrated circuits, the need for scalability and advanced performance of ESD devices is also increasing. Additionally, highly scaled semiconductor devices, such as Fin Field Effect Transistor (FinFETs) device, are especially vulnerable to ESD stress.

An ESD event is a high current (up to 2 amps), short duration (typically 150 nanoseconds), high voltage (up to 2 kilovolts) event. Therefore, an ESD protection device must not turn on until the ESD voltage increases above the highest operating voltage of the devices it is supposed to protect, but must generally be able to turn on within 1 nanosecond (ns) before the ESD voltage reaches a level that would damage such devices. The ESD device must be able to clamp the ESD voltage at as low a level as possible in order to avoid damaging any semiconductor devices. Further, the ESD device must be able to shunt more than an amp of the ESD current to ground. ESD devices are generally implemented on all input and output (I/O) devices, between power lines (if possible) and between power lines and ground.

Prior art ESD devices utilize the heavily doped source/drain regions of FinFETs together with the underlying lightly doped well portion of the bulk substrate to form an NPN bipolar transistor in series with a ballasting resistor. Problematically, these types of ESD devices typically clamp the ESD voltage between 3.5-5 volts (V) and can only carry about 0.7 amps (A) before being damaged.

Another prior art ESD device utilizes the surrounding semiconductor structure of a FinFET to form a silicon-controlled rectifier (SCR) device in order to clamp the ESD voltage and shunt the ESD current. These SCR devices can carry much larger currents than the NPN transistor devices. However, the SCR devices do not typically turn on until the ESD voltage reaches 15 volts or higher, which will damage many semiconductor devices that need protection.

Accordingly, there is a need for an ESD device that turns on at a voltage level that is higher than the highest operating range of the devices it is supposed to protect and lower than a voltage level that will damage such devices. Additionally, there is a need that the ESD device should be able to clamp the ESD voltage at a very low voltage, for example at 3 volts or less. Further there is a need for an ESD device that can shunt the ESD current at levels above 1 A without being damaged.

BRIEF DESCRIPTION

The present invention offers advantages and alternatives over the prior art by providing and ESD device that can turn on at about 4 volts, can handle more than 2 amps of ESD pulse current, and clamps the ESD pulse voltage at less than 3 volts. Additionally, the ESD device does not require a ballast resistor and is therefore more scalable than the prior art.

An electrostatic discharge (ESD) device for an integrated circuit in accordance with one or more aspects of the present invention includes a substrate having a longitudinally extending fin dispose thereon. A first n-type FinFET (NFET) is disposed within the fin. The NFET includes an n-type source, an n-type drain and a p-well disposed within the substrate under the source and drain. A p-type FinFET (PFET) is disposed within the fin. The PFET includes a p-type source/drain region and an n-well disposed within the substrate under the source/drain region. The n-well and p-well are located proximate enough to each other to form an np junction therebetween. The p-type source/drain region of the PFET and the n-type drain of the NFET are electrically connected to a common input node.

In another aspect of the present invention an ESD device for an integrated circuit includes a substrate. An n-type source, an n-type drain and a p-well are disposed within the substrate. The p-well is located under the source and drain. A p-type source/drain region and an n-well are disposed within the substrate. The n-well is located under the source/drain region. The n-well and p-well are located proximate enough to each other to form an np junction therebetween. The p-type source/drain region and the n-type drain are electrically connected to a common input node. The n-type source and the p-well are electrically connected to an electrical ground through a common ground node.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
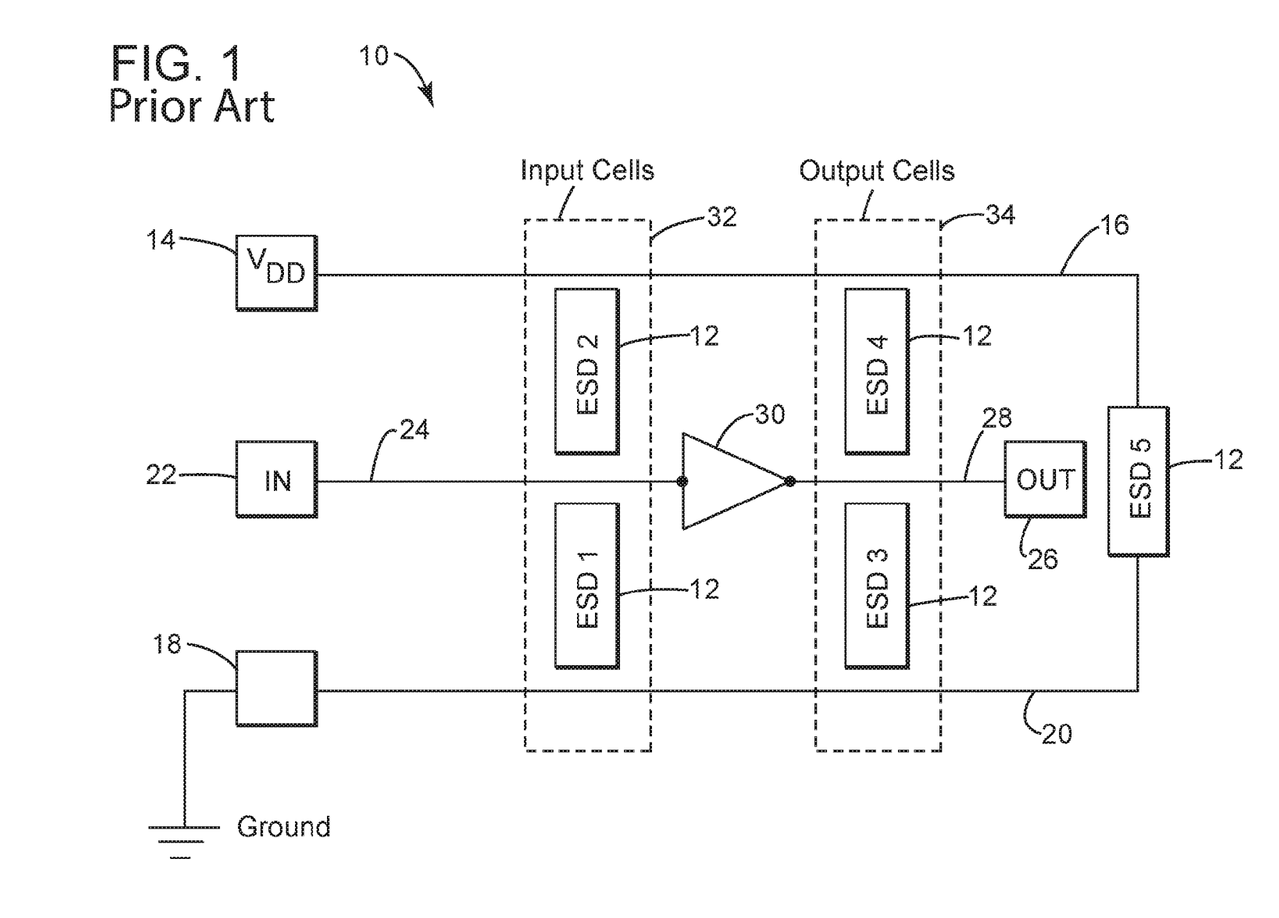
FIG. 1 is an electrical schematic of an integrated circuit with a prior art ESD device.
Figure 2A:
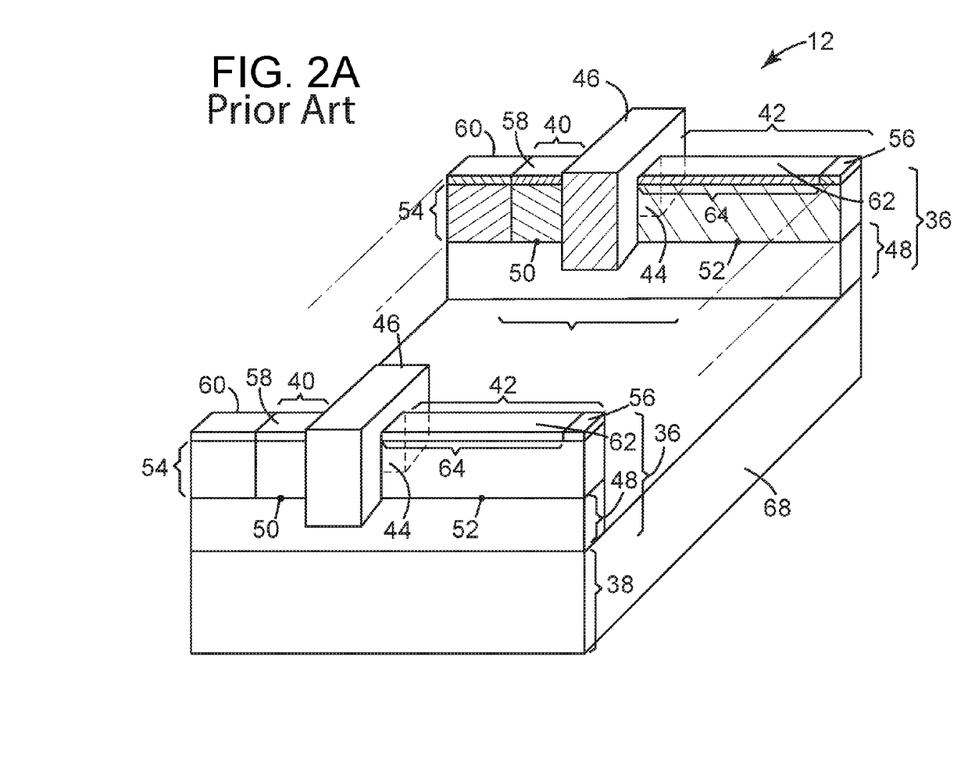
FIG. 2A is a perspective view of the prior art ESD device of FIG. 1.
Figure 2B:
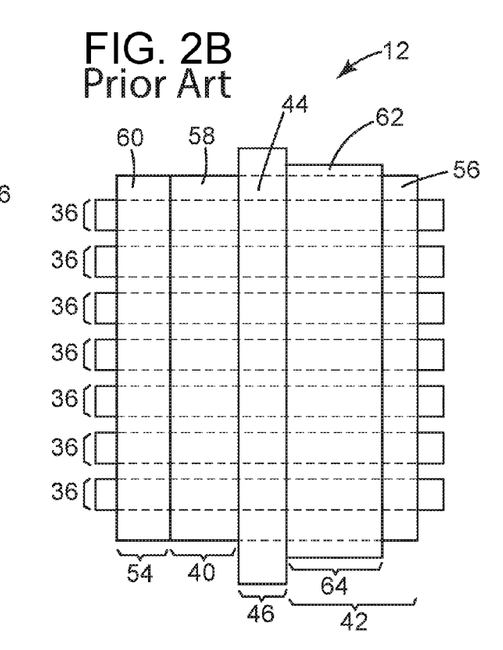
FIG. 2B is a top view of FIG. 2A.
Figure 3:
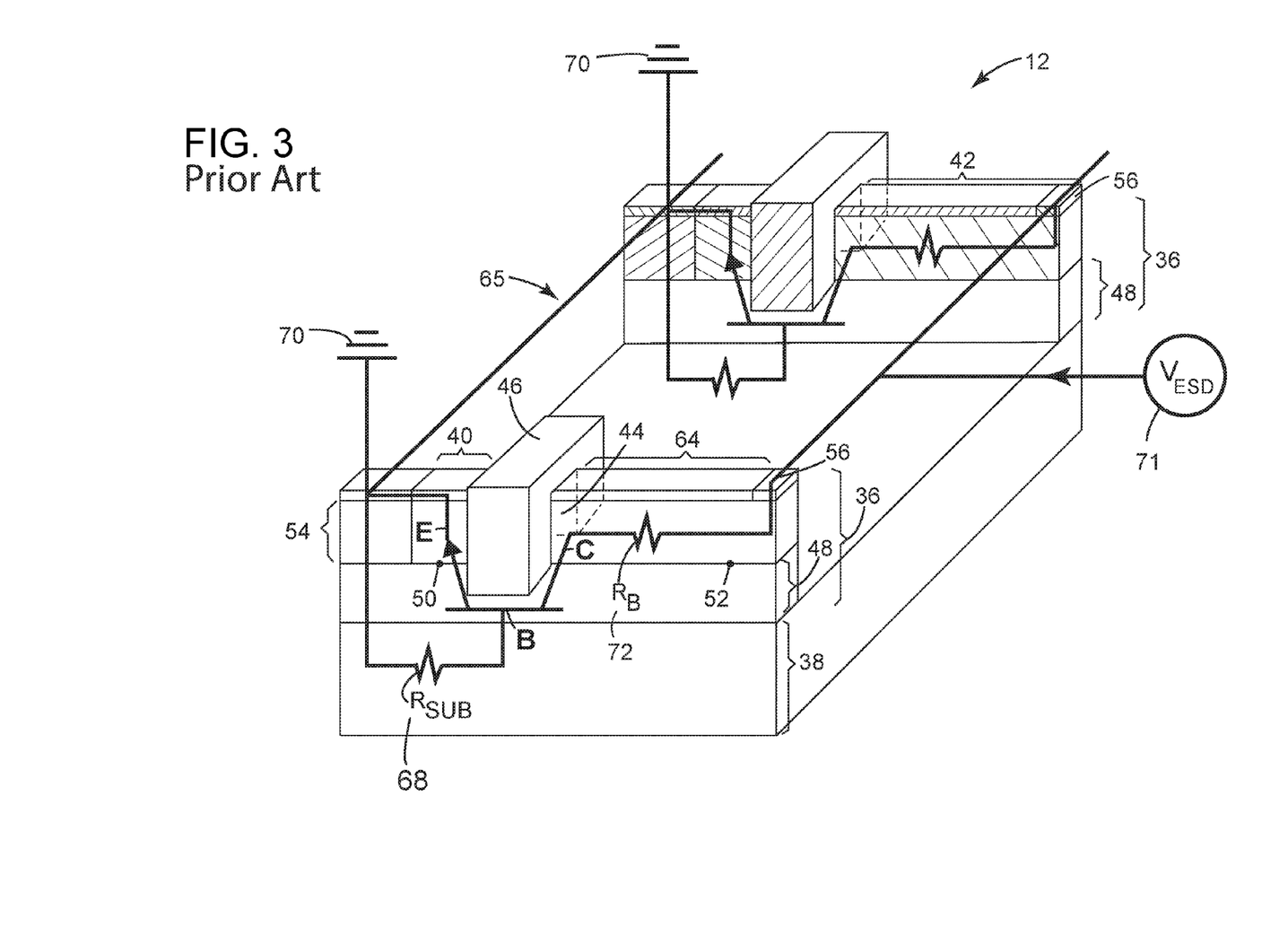
FIG. 3 is an electrical schematic overlaying the structure of the prior art ESD device of FIG. 2A.

FIGS. 1-3 illustrate various exemplary embodiments of prior art ESD devices for semiconductor structures and their performance. FIGS. 4-8 illustrate various exemplary embodiments of an ESD device having an SCR in parallel with an NPN transistor and their performance in accordance with the present invention.

Referring to FIG. 1, an ESD event is a high current, short duration event that will unavoidably happen fairly frequently throughout an integrated circuit's operable lifetime. The ESD event can occur, for example, simply with the touch from a human finger upon the integrated circuit. A human body can discharge up to 2 amps of electric current with up to 2 kV voltage potential in a pulse of 150 ns through a semiconductor structure of an integrated circuit.

Therefore, in order to protect an integrated circuit from such an ESD event, an ESD protective device must be able to turn on quickly (less than 1 ns) to clamp the ESD pulse voltage below a level that is harmful to the individual components of the integrated circuit and shunt the ESD pulse current to ground. The ESD device must be able to carry the ESD pulse current for 150 ns without being damaged. Additionally, the ESD device must be scalable in order to protect increasingly smaller integrated circuits.

FIG. 1 shows a simplified schematic of an integrated circuit 10 with prior art ESD devices 12 included therein for protection. Integrated circuit 10 includes an input power terminal (or supply) 14 (with its associated power lines 16), a ground terminal 18 (with its associated ground lines 20), a signal input terminal 22 (with its associated input signal lines 24) and a signal output terminal 26 (with its associated signal output lines 28), all of which are designed to provide power and/or signals into and out of the circuitry 30 of the integrated circuit 10. In order to protect the circuitry 30 from an ESD event, ESD devices 12 are generally placed on all input cells 32 and all output cells 34 that support the circuitry 30. Additionally, the ESD devices 12 are generally placed between the power lines 16 and the ground lines 20 of the integrated circuit 10.

Referring to FIGS. 2A and 2B, a simplified perspective view (FIG. 2A) and a top view (FIG. 2B) of the prior art ESD device 12 of the integrated circuit 10 represented in the schematic of FIG. 1 are presented. ESD device 12 utilizes the various np junctions that exist in the semiconductor structure of a conventional n-type fin field effect transistor (n-type FinFET or NFET) to convert the NFET into an NPN-BJT transistor (or NPN transistor) during an ESD event.

More specifically, ESD device 12 includes an array of longitudinally extending parallel fins 36 formed over a bulk substrate 38. Each fin 36 includes an epitaxially grown n-type source region 40 and a relatively elongated epitaxially grown n-type drain region 42 separated by a channel region 44 therebetween. A gate 46 is disposed over the vertically extending sides and top of the channel region 44. A p-well 48 is disposed within the lower portion of the fin 36 and partially into the substrate 38. The source region 40 and drain region 42 are significantly more heavily doped with n-type dopants than the p-well is doped with p-type dopants. For example, the source 40 and drain 42 are typically doped with such pentavalent n-type impurities as phosphorous, arsenic or antimony within a range of $1 \times 10^{18}/\text{cm}^2$-$6 \times 10^{22}/\text{cm}^2$, while the p-well 48 is typically doped with such trivalent p-type impurities as boron/fluorine implants (such as B, F, BF or BF2), gallium or indium within a range of $1 \times 10^{15}/\text{cm}^2$-$1 \times 10^{18}/\text{cm}^2$.

The p-well 48 is located directly under the source 40 and drain 42 of each fin 36. As will be explained in greater detail herein, it is important to note that the boarder region 50 between the relatively heavily doped source 40 and relatively lightly doped p-well 48 forms a first np-junction 50. Additionally, it is important to note that the boarder region 52 between the relatively heavily doped drain 42 and relatively lightly doped p-well 48 forms a second np-junction 52.

For purposes of clarity herein, an np-junction is well known, wherein a depletion region is formed at the np-junction. That is, when an n-type semiconductor material and a p-type semiconductor material form an np-junction, free electrons from n-type dopants in the n-type semiconductor material (in this case the source 40 and drain 42) diffuse across the np-junction to the p-type material (in this case the p-well 48), leaving behind a region of positively charged ions on the n-type side of the pn-junction. Simultaneously, holes from the p-type dopants in the p-type semiconductor material (in this case the p-well 48) diffuse across the np-junction to the n-type material (in this case the source 40 and drain 42) leaving behind a region of negatively charged ions on the p-type side of the np-junction. The region of negatively charged ions on the p-type side (e.g., the p-well) and the positively charged ions on the n-type side (e.g., the source 40 and drain 42) is well known as a depletion region that is inherently formed by any np-junction.

The presence of charged ions on either side of a pn-junction causes a voltage barrier (an inherent voltage potential difference) to be established across the pn-junction with the n-type material being positive with respect to the p-type material within the depletion region. The voltage barrier must be overcome before current can flow across the junction. For example, if germanium is the semiconductor material, the voltage barrier is substantially 0.3 V and, if silicon is the semiconductor material, the voltage barrier is substantially 0.7V. If an external voltage source (such as an ESD pulse voltage during an ESD event) is applied to the pn-junction such that the p-type side becomes more positive than the n-type side, than the pn-junction is said to be forward biased, the depletion region will shrink, and current will flow with only a voltage drop across the pn-junction equal to that of the original voltage barrier (e.g., 0.3V for germanium and 0.7 V for silicon). However, if the external voltage source is applied such that the n-type side becomes even more positive than the p-type side, than the pn-junction is said to be reversed biased, the depletion region will expand, and current will not flow until the voltage across the pn-junction becomes significantly high enough to cause avalanche breakdown to occur across the pn-junction. Accordingly, the pn-junction functions as a diode, which opposes current flow in the reverse biased direction and allows current flow in the forward biased direction.

Avalanche breakdown is well known and occurs when the voltage across the reversed biased pn-junction becomes strong enough (sometimes as high as 15 volts or more) to accelerate charge carriers (electrons or holes) to high enough speeds to knock other bound carriers free. In turn, these newly freed carriers knock more carriers free creating an avalanche affect which increases current to flow rapidly and often damages components not designed to handle such heavy currents.

Referring further to FIGS. 2A and 2B, the source 40, drain 42, channel 44, gate 46 and p-well 48 form the structure of an NFET commonly used throughout the circuitry 30 of the integrated circuit 10. This structure, when used as an NFET, is designed to conduct milliamps of current through the channel 44. However, the ESD device 12 must be able to conduct several orders of magnitude more current than a functioning NFET during an ESD event (e.g., on the order of 0.5 to 2 Amps). For that reason the np junctions 50 and 52 are utilized to function as an NPN transistor that can conduct current through the bulk substrate 38 itself during an ESD event.

ESD device 12 also includes a p-type doped p-well-tap 54. The p-well tap 54 provides continuity between the p-well 48 and a ground 70 (best seen in FIG. 3) of the integrated circuit 10. Additionally, a drain silicide layer 56, a source silicide layer 58 and a well-tap silicide layer 60 overlay the drain 42, source 40 and well-tap 54 respectively. Each silicide layer 56, 58, 60 is required for proper formation of electrical contacts to the drain 42, source 40 and well-tap 54 respectively. Additionally, each silicide layer 56, 58, 60 functions as an electrical bus interconnecting all the drains 42, sources 40 and well-taps 54 respectively as three separate parallel extending nodes.

An S-block layer 62 overlays a major portion of drain 42 to form a silicide-free portion 64 of the drain 42. Since silicides are inherently better conductors than the epitaxially grown drain material (typically silicon, germanium or the like), the resistivity of the silicide-free portion 64 of the drain 42 is significantly higher than that portion of the drain 42 covered with the drain silicide layer 56. As a result, and as will be explained in greater detail herein, the silicide-free portion 64 of the drain 42 acts as a ballast resistor in series with the NPN transistor of the ESD device 12.

Referring to FIG. 3, a functional electric schematic 66 overlaying the structure of prior art ESD device 12 is presented. An NPN transistor 66 is formed from the source 40, drain 42 and p-well 48. The drain 42 is the functioning collector (C) and the p-well 48 is the functioning base (B), which together form the second np-junction 52 of transistor 66. The source 40 is the functioning emitter (E), which, together with p-well 48, forms the second np-junction 50 of transistor 66. The resistivity of the substrate 38 functions as a resistor 68 (Rsub), which is connected from the base B (p-well 48) to ground 70 through the well-tap 54. The emitter E (source 40) is also connected to ground 70. Finally, the silicide free portion 64 of the drain 42 acts as a ballast resistor 72 (Rb), which is connected from the collector C (drain 42) to an incoming ESD pulse voltage (Vesd) 71 through the drain silicide layer 56.

Figure 4:
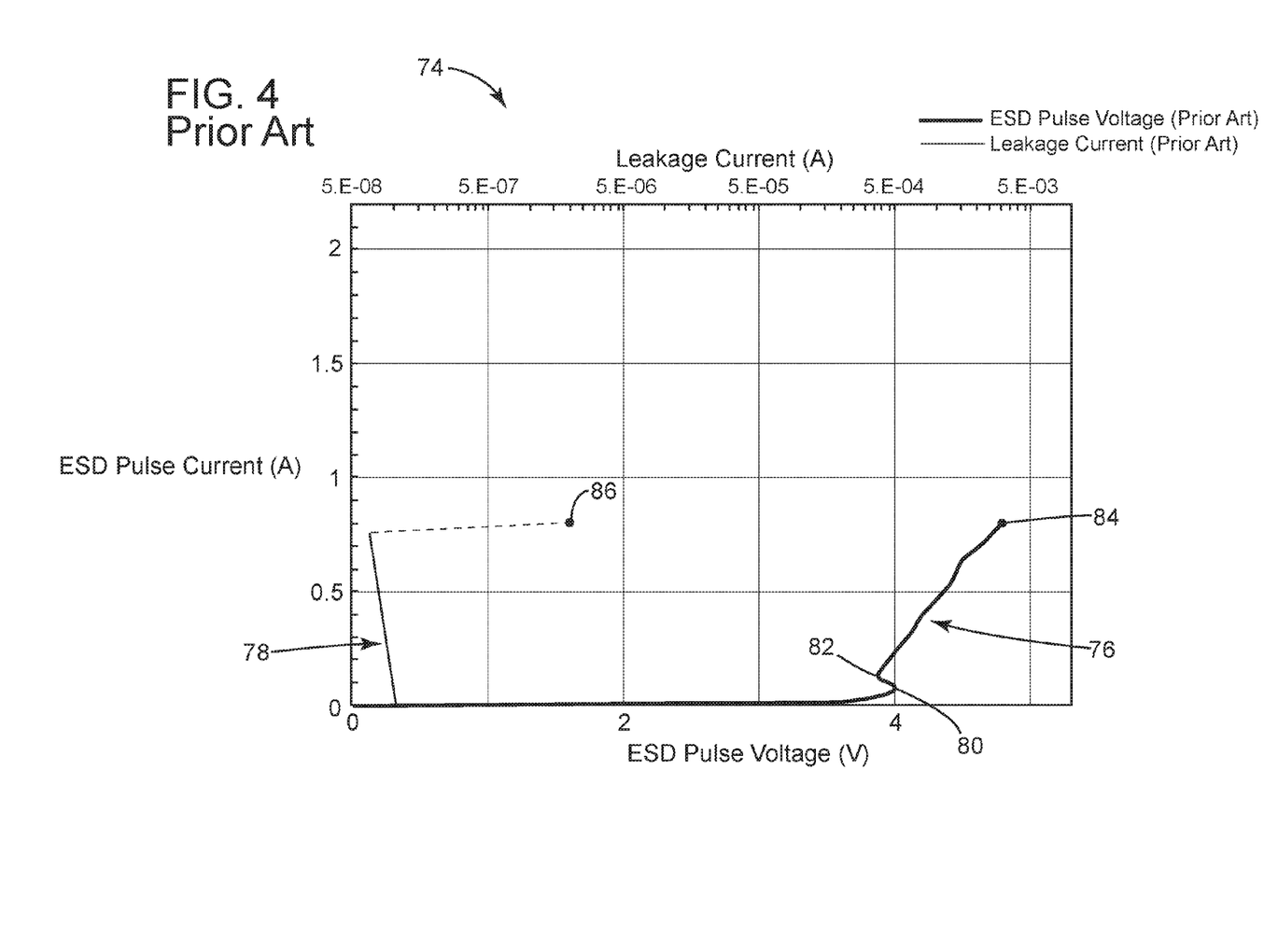
FIG. 4 is a combined graph of ESD pulse voltage to ESD pulse current and Leakage current to ESD pulse current of the prior art device of FIG. 3.

Referring to FIG. 4, a combined graph 74 of ESD pulse voltage to ESD pulse current 76 and Leakage current to ESD pulse current 78 is presented. During operation, the ESD device 12 is usually dormant since transistor 66 is not active due to the reverse biased pn-junction 52. However, when an ESD event occurs, an ESD pulse voltage will enter the ESD device 12 through the drain silicide layer 56 and the voltage across the ESD device 12 will climb rapidly. When the ESD pulse voltage reaches approximately 4 volts, an avalanche breakdown (point 80 on the graph 76) is initiated across the pn-junction 52, forcing the transistor 66 to conduct.

It is important to note that the avalanche breakdown voltage across pn-junction 52 is greater than the highest operating voltage of the devices within the circuitry 30 of integrated circuit 10 (best seen in FIG. 1), but less than a voltage level that will damage those devices. The reason that the avalanche breakdown voltage is relatively low at about 4 V is due, in large part, to the difference in dopant concentrations between the drain 42 and the p-well 48. The drain 42 has a relatively heavy n-type dopant concentration that is typically within a range of $1\times10^{18}/cm^2$-$6\times10^{22}/cm^2$, whereas the p-well has a relatively light p-type dopant concentration that is typically within a range of $1\times10^{15}/cm^2$-$1\times10^{18}/cm^2$. A pn-junction with a heavy n-type dopant concentration on one side and a light p-type dopant on the other side generally initiates avalanche breakdown within a range of 4 to 5 V, which is relatively low compared to other pn-junction concentrations such as when the dopant concentrations are both light and about equal.

Almost instantaneously thereafter, an initiating current will flow through the base B to ground 70 bringing the voltage at the base up high enough to turn the NPN transistor 66 on in its normal operating mode. Once the transistor turns on, the collector voltage decreases to a snapback holding voltage (point 82 on the graph 76) of about 3.8 Volts (V), which brings the np-junction 52 out of avalanche breakdown. The ballast resistor 72 is sized to limit the current through the transistor 66 and prevent damage to the transistor during the ESD event. As such, the snap back holding voltage 82 of about 3.8 V is not much smaller than the initial avalanche breakdown voltage of approximately 4 V, due to the combined voltage drop across the transistor 66 and ballast resistor 72.

Thereafter, the ESD device will continue to conduct current for the duration of the ESD event. The ESD device can carry up to approximately 0.7 Amps (A) at about 4.8 volts (point 84 on graph 76). At that point, however, the leakage current 78 jumps several orders of magnitude from roughly 5.E-08 A to roughly 5.E-06 A (point 86 on graph 78), which indicates that the ESD device is damaged.

Problematically, this type of prior art ESD device 12 is limited to about 0.7 A before it is damaged. Additionally, the size of the ballast resistor 72 (the silicide-free portion 64 of the drain 42) cannot be easily scaled since its ability to limit the ESD current is fixed by its inherent resistivity. Also problematically, the snap-back holding voltage 82 is almost equal to the initial avalanche breakdown 80, which means that the power dissipated during the ESD event is relatively high.

Figure 5:
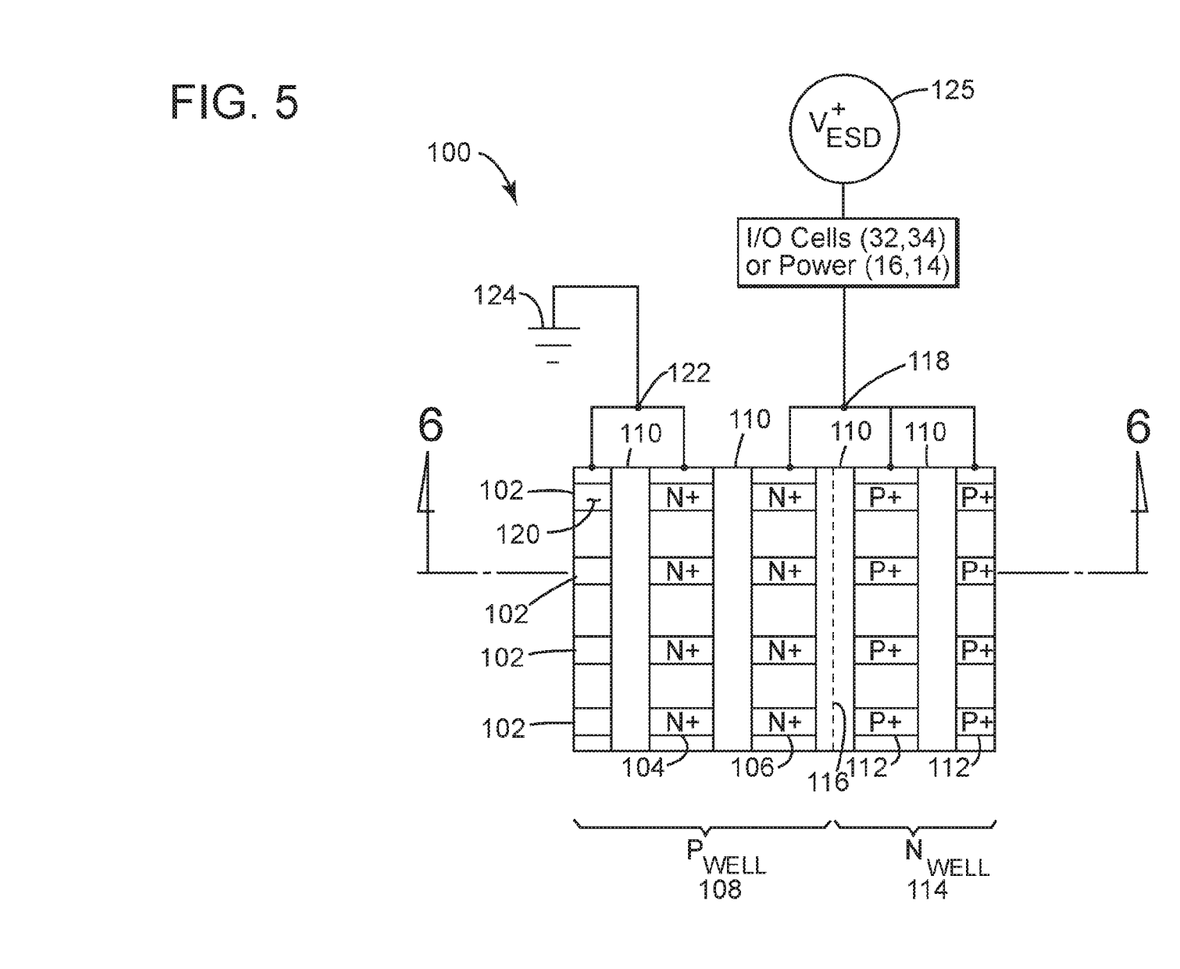
FIG. 5 is a top view of an ESD device in accordance with the present invention.

Referring to FIG. 5, a top view of an ESD device 100 in accordance with the present invention is presented. ESD device 100 includes an array of longitudinally extending parallel fins 102. Each fin 102 includes an n-type source region 104 and an n-type drain region 106 disposed over a p-well 108 and separated by a gate 110 to define the structure of an NFET. Additionally, each fin 102 also includes a plurality of p-type source/drain regions 112 disposed over an n-well 114 and separated by a gate 110 to define the structure of a p-type field effect transistor (p-type FinFET or PFET).

Importantly, the n-well 114 and p-well 108 are located proximate enough to each other to form and np-junction 116 therebetween. Also significantly, all p-type source/drain regions 112 and an n-type drain 110 are electrically connected together to a common input node 118. The input node 118 functions as the input to the ESD device 100 and is generally connected to an input cell 32, an output cell 34, a power line 16, a power supply (or terminal) 14 (such as illustrated in FIG. 1) or the like. Input node 118 is also where an ESD pulse voltage 125 (Vesd) would enter the ESD device 100 during an ESD event.

ESD device 100 also includes a p-well tap 120 that provides continuity to the p-well 108. It is important to note that the p-well tap (and, therefore the p-well) is electrically connected to a common ground node 122, which in turn is connected to an electrical ground 124 of the integrated circuit (such as integrated circuit 10, best seen in FIG. 1) that the ESD device 100 is designed to protect from an ESD event.

Figure 6:
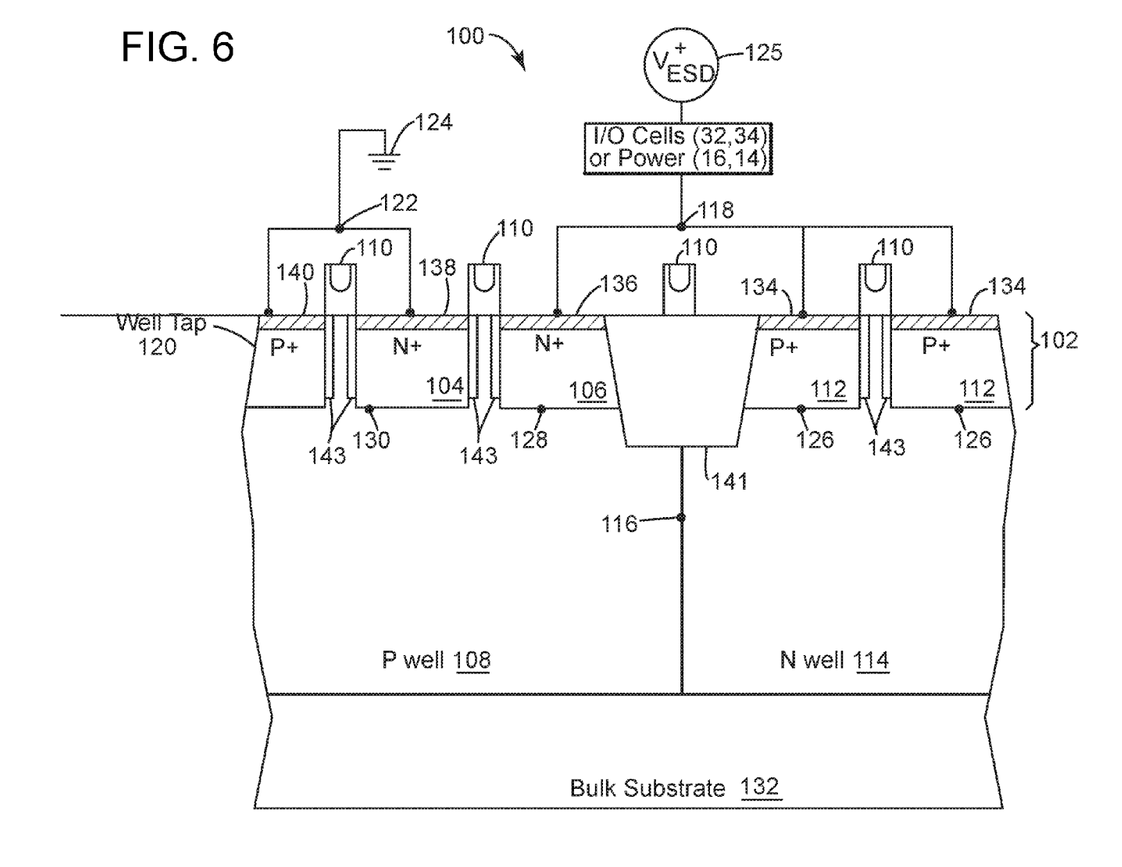
FIG. 6 is a side view of the ESD device taken along the line 6-6 of FIG. 5 in accordance with the present invention.

Referring to FIG. 6, a side view of the ESD device 100 taken along the line 6-6 of FIG. 5 is presented. There are four types of pn-junctions created in the structure of ESD device 100. They are as follows:

pn-junction 126 between all p-type source/drain regions 112 and n-well 114, wherein the source/drain regions 112 are heavily doped (typically within a range of concentrations between $1\times10^{18}/cm^2$-$6\times10^{22}/cm^2$) and the n-well is lightly doped (typically within a range of $1\times10^{15}/cm^2$, $1\times10^{18}/cm^2$);

pn-junction 116 between p-well 108 and n-well 114, wherein the p-well is lightly doped (typically within a range of concentrations between $1\times10^{15}/cm^2$-$1\times10^{18}/cm^2$) and the n-well is lightly doped;

pn-junction 128 between n-type drain region 106 and p-well 108, wherein the drain 106 is heavily doped (typically within a range of concentrations between $1\times10^{15}/cm^2$-$1\times10^{18}/cm^2$) and the n-well is lightly doped; and pn-junction 130 between n-type source region 104 and p-well 108, wherein the source 104 is heavily doped (typically within a range of concentrations between $1\times10^{18}/cm^2$-$6\times10^{22}/cm^2$) and the n-well is lightly doped. Note that in most cases, the n-type source 104 and the n-type drain 106 will be doped to essentially the same concentration levels.

A bulk substrate 132 underlies both the n-well 114 and p-well 108. Bulk substrate 132 is generally not doped or intrinsic and therefore has an inherently high resistivity.

Disposed over the p-type source/drain regions 112 is a p-type source/drain silicide layer 134. Disposed over the n-type drain 106 is an n-type drain silicide layer 136. Disposed over the n-type source 104 is an n-type source silicide layer 138. Finally, disposed over the p-type well-tap 120 is a well-tap silicide layer 140. The silicide layers 134, 136, 138 and 140 enhance the electrical connectivity of the source/drain regions 112, drain 106, source 104 and well-tap 120 respectively. Additionally, each silicide layer 134, 136, 138, 140 functions as an electrical bus interconnecting all the source/drains 112, drains 106, sources 104 and well-taps 120 respectively as at least four separate parallel extending nodes.

A shallow trench isolation (STI) region 141 is disposed in the upper portions of the p-well 108 and n-well 114 to separate the n-type source and drain regions 104, 106 from the p-type source/drain regions 112. Additionally a pair of lightly doped drain (LDD) regions 143 are disposed within the channels of the NFET and PFET structures.

Figure 7:
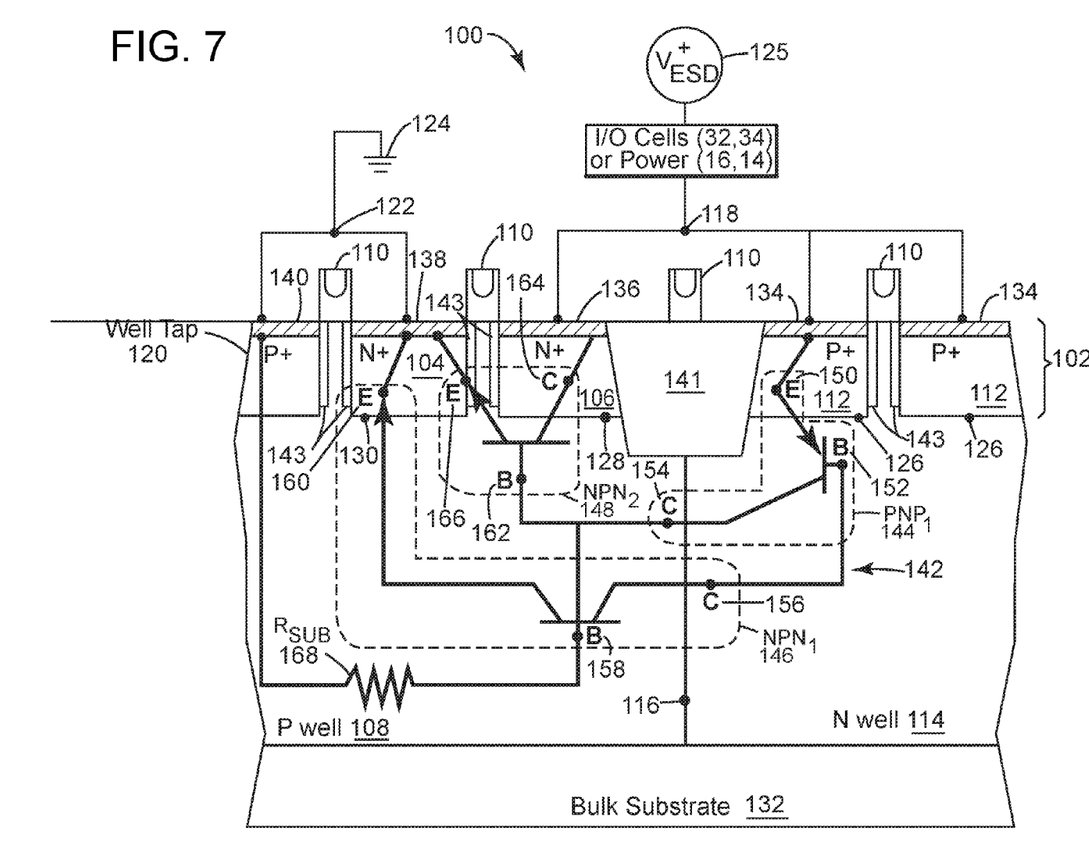
FIG. 7 is an electrical schematic overlaying the structure of the ESD device of FIG. 6 in accordance with the present invention.

Referring to FIG. 7, a functional electric schematic 142 overlaying the structure of ESD device 100 in accordance with the present invention is presented. By having the ESD device 100 include both NFET and PFET structures in close proximity and electrically connecting those structures as shown, the ESD device 100 operates as a silicon-controlled rectifier (SCR) in parallel with an NPN transistor when an ESD event is conducted through the input node 118 to the ground node 122.

More specifically, there are three basic BJT transistors inherent in the structure of ESD device 100. They are a first PNP transistor 144, a first NPN transistor 146 and a second NPN transistor 148.

The first PNP transistor 144 includes an emitter (E) 150 formed from the p-type source/drain region 112, a base (B) 152 formed from the n-well 114, and a collector (C) 154 formed from the p-well. For purposes of simplicity, only a single source/drain region 112 is shown to function as the emitter 150 of the first PNP transistor 144. However, one skilled in the art would recognize that since all the source/drain regions 112 are electrically connected to the input node in parallel, they all would function as emitters 150 for transistor 144. The first NPN transistor 146 includes a collector 156 formed from the p-well 114, a base 158 formed from the p-well 108 and an emitter 160 formed from the n-type source 104.

Figure 8:
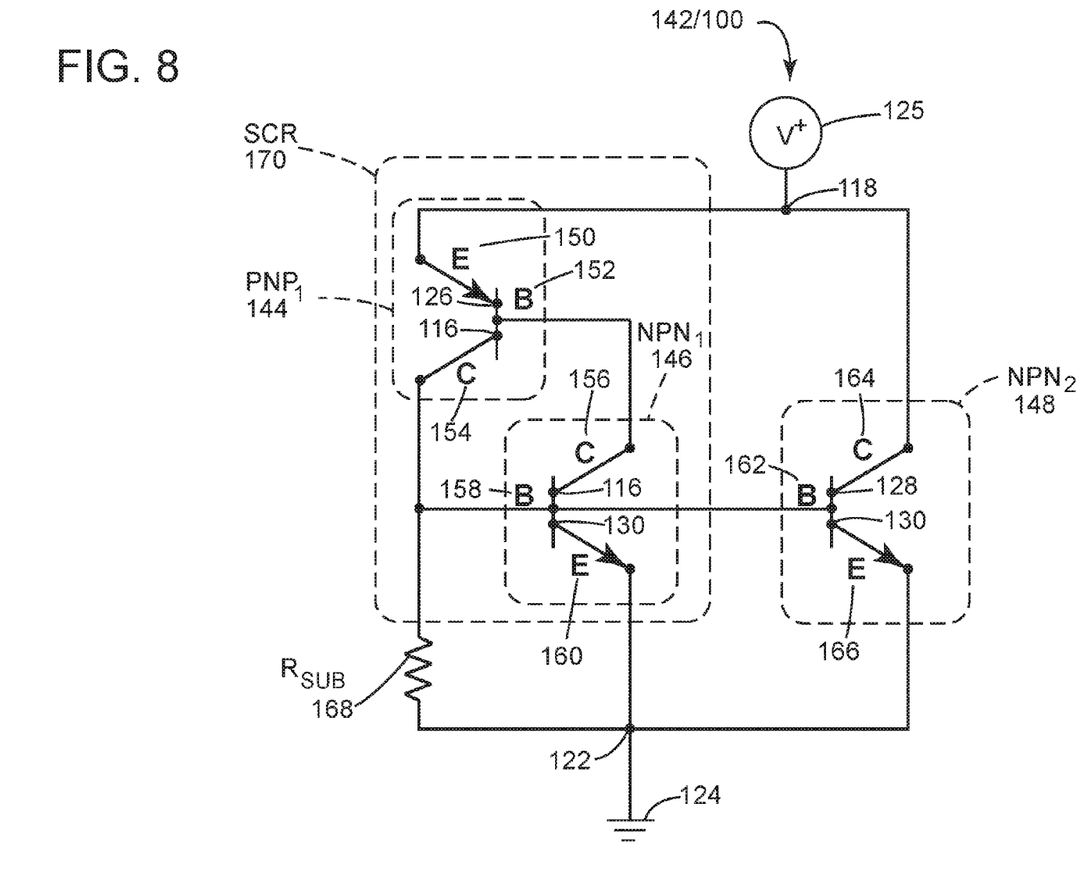
FIG. 8 is the electrical schematic of FIG. 7 without the overlying structure of the ESD device in accordance with the present invention.

The combination of the first PNP transistor 144 and first NPN transistor 146 form the structure of a functioning SCR 170 (best seen in FIG. 8). Within such an SCR, the base 152 of the first PNP transistor is electrically connected to the collector 156 of the first NPN transistor within the n-well 114 and the base 158 of the first NPN transistor is electrically connected to the collector of the first PNP transistor within the p-well 108.

The SCR structure alone is capable of theoretically providing ESD protection in and of itself. However, the SCR would have one major drawback in that the ESD voltage pulse 125 would have to trigger the SCR by initiating an avalanche breakdown at the p-well to n-well pn-junction 116. Problematically, because both the p-well 108 and n-well 114 are lightly doped and about equal in dopant concentration, the initiating avalanche breakdown is about 15 V or higher. Unfortunately, such a high initiating avalanche breakdown voltage would damage many components within an integrated circuit (such as integrated circuit 10) that the SCR is supposed to protect during an ESD event. For this reason, an SCR alone is problematic as an ESD protection device.

The second NPN transistor 148 of ESD device 100 includes a base 162 formed from the p-well 108, a collector 164 formed from the n-type drain 106 and an emitter 166 formed from the n-type source 104. Additionally, the base 162 of the second NPN transistor 148 is electrically connected to both the base 158 of the first NPN transistor 146 and the collector 154 of the first PNP transistor 144 at the p-well 108. The collector 164 of the second NPN 148 is also connected to the input node 118 through the n-type drain 106. Finally, the emitter 166 of the second NPN 148 is also connected to the emitter 160 of the first NPN 146 at the n-type source 104, which is connected to the ground 124 through the ground node 122.

The resistivity of the bulk substrate 132 functions as a resistor (Rsub) 168, which is connected from the base 158 of the first NPN transistor 146 to ground 124 through the well-tap 120. Finally, it is important to note that there is no silicide free portion of the n-type drain 106 required to act as a ballast resistor in this exemplary embodiment of ESD device 100.

Referring to FIG. 8, for purposes of clarity the functioning electrical schematic 142 of ESD device 100 is presented without the overlying structure of ESD device 100. As can more clearly be seen from FIG. 8, the first PNP transistor 144 and first NPN transistor 146 are connected to function as an SCR 170. Additionally, the SCR 170 and the second NPN transistor 148 are electrically connected in parallel between the input node 118 and ground node 122.

During operation, the ESD device 100 is usually dormant since the SCR 170 the second NPN transistor 148 are not active. The SCR is not active due to the reverse biased pn-junction 116, which functions as the base 152 to collector 154 junction of first PNP transistor 144 and also functions as the collector 156 to base 158 junction of the first NPN transistor 146. The second transistor is not active due to the reverse biased pn-junction 128, which functions as the collector 164 to base 162 junction of the second NPN transistor 148.

However, when an ESD event occurs, and ESD pulse voltage 125 will enter the ESD device 100 through input node 118 and the voltage across the parallel connected SCR 170 and second NPN transistor 148 of ESD device 100 will climb rapidly. When the ESD pulse voltage 125 reaches approximately 4 volts, an avalanche breakdown is initiated across the pn-junction 128 of second NPN transistor 148, forcing the transistor 148 to conduct.

It is important to note that the avalanche breakdown voltage across pn-junction 128 is greater than the highest operating voltage of the devices within the circuitry of an integrated circuit (e.g., such as the circuitry 30 of integrated circuit 10, best seen in FIG. 1), but less than a voltage level that will damage those devices. The reason that the avalanche breakdown voltage is relatively low at about 4 V is due, in large part, to the difference in dopant concentrations between the drain 106 and the p-well 108. The drain 106 has a relatively heavy n-type dopant concentration that is typically within a range of $1 \times 10^{18}/cm^2$-$6 \times 10^{22}/cm^2$, whereas the p-well 108 has a relatively light p-type dopant concentration that is typically within a range of $1 \times 10^{15}/cm^2$-$1 \times 10^{18}/cm^2$. A pn-junction with a heavy n-type dopant concentration on one side and a light p-type dopant on the other side generally initiates avalanche breakdown within a range of 3.5 to 5 V and more preferably within a range of 4 to 4.5V.

It is also important to note, that the threshold initiating avalanche breakdown voltage of pn-junction 116 (typically about 15V) of SCR 170 is much higher than that of pn-junction 128 (typically about 4V) of second NPN transistor 148. Therefore, the second NPN transistor 148 will reach avalanche breakdown and turn on at much lower voltage levels than SCR 170.

SCRs alone are problematic as ESD devices because their initiating avalanche breakdown voltage levels are generally too high for conventional semiconductor devices (such as transistors, capacitors or the like) to handle without being damaged. The reason that the avalanche breakdown voltage is relatively high at about 15V across pn-junction 116 is due in large part to dopant concentrations of the p-well 108 and n-well 114. More specifically, pn-junction 116 is formed from the p-well 108 to n-well 114 junction. The p-well 108 has a relatively light p-type dopant concentration that is typically within a range of $1 \times 10^{15}/cm^2$-$1 \times 10^{18}/cm^2$. The n-well 114 also has a relatively light n-type dopant concentration that is typically within a range of $1 \times 10^{18}/cm^2$-$6 \times 10^{22}/cm^2$. A pn-junction with a light p-type dopant concentration on one side and a light n-type dopant concentration on the other side generally initiates avalanche breakdown within a range of 15-16V.

Referring further to FIG. 8, almost instantaneously after avalanche breakdown turns the second NPN transistor 148 on, current flows through the base 162 of the second NPN transistor 148 to ground 124. Current also flows across the base 158 of the first NPN transistor 146 to ground 124, therefore turning the first NPN transistor 146 on. This causes the first PNP transistor 144 to turn on and conduct. This then brings the voltage level across Rsub 168 up and supplies the bases 158 and 162 of the first and second transistors 146, 148 with current so that all three transistors 144, 146 and 148 are now latched on in their normal operating mode for the duration of the ESD event.

Figure 9:
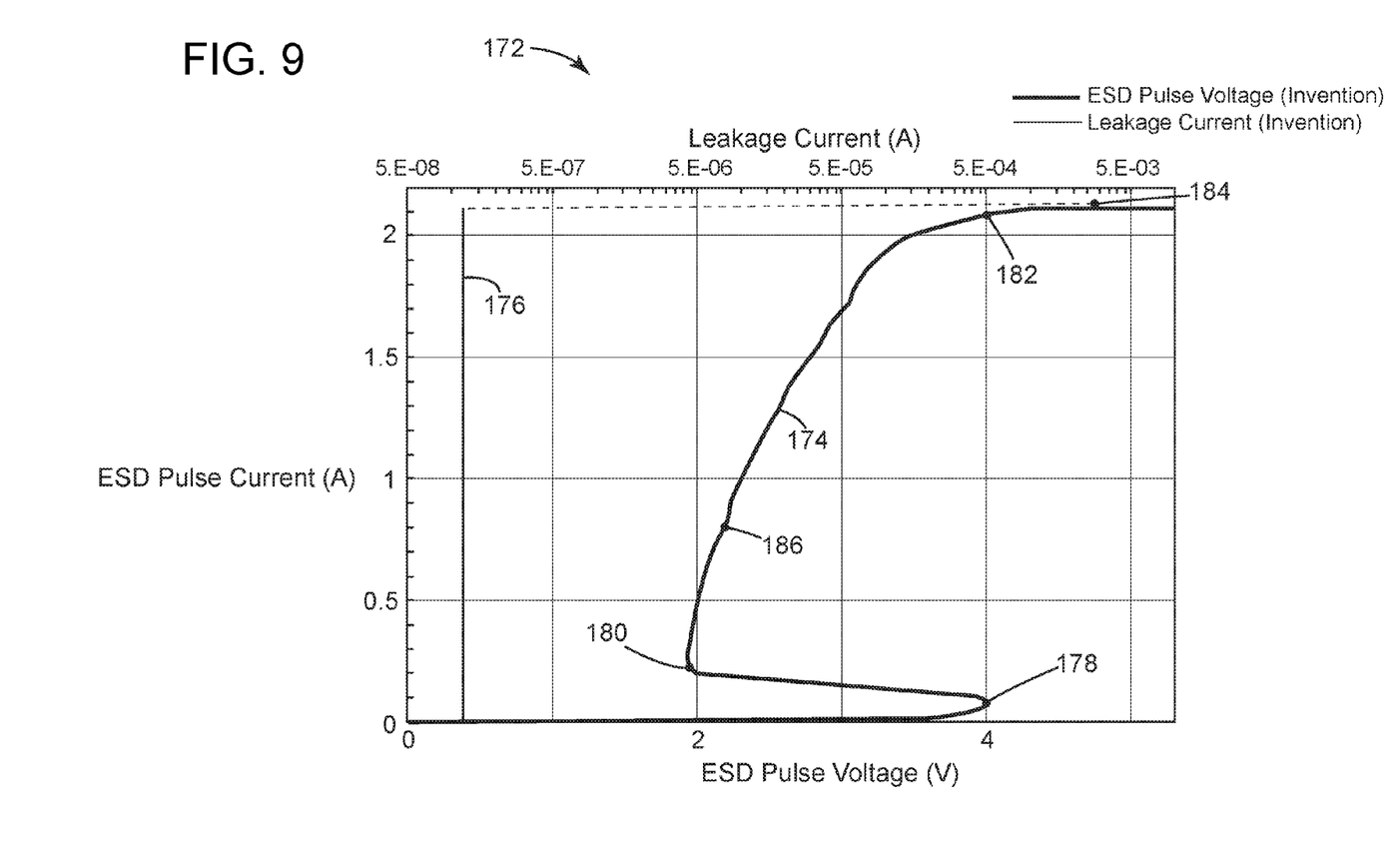
FIG. 9 is a combined graph of ESD pulse voltage to ESD pulse current and Leakage current to ESD pulse current of the ESD device of FIG. 7 in accordance with the present invention.

Referring to FIG. 9, a combined graph 172 of ESD pulse voltage to ESD pulse current 174 and Leakage current to ESD pulse current 176 is presented. As discussed with reference to FIG. 8, when the ESD pulse voltage 125 reaches approximately 4 volts, an avalanche breakdown is initiated across the pn-junction 128. This forces the second NPN transistor 148 on, which in turn latches the SCR 170 on in its normal operating mode. This can be seen at point 178 of graph 174.

Once the SCR 170 is latched on in its normal operating mode, the voltage across the SCR 170 and second NPN transistor 148 will decrease to a snapback holding voltage (point 180 of graph 174) of about 2V. This brings the np-junction 128 of the second NPN transistor 148 out of avalanche breakdown and allows the second NPN transistor to function in its normal operating mode.

The reason the snapback voltage of ESD device 100 is a relatively low 2V (compared to about 3.8V for prior art ESD device 12, best seen in FIG. 4) is that there are only two forward biased pn-junctions 126 and 130 that must be crossed to get to ground 124 when the SCR 170 is latched on. As such the ESD voltage across the ESD device 100 will be within a range of 1.2 to 2.5 volts when the ESD device is conducting 0.5 amps or less of ESD current. Also, in contrast to prior art ESD device 12, there is not ballast resistor (such as resistor 72 of ESD device 12) required to limit current through the ESD device 100.

Thereafter, the ESD device 100 will continue to conduct current for the duration of the ESD event. The ESD device 100 can carry up to approximately 2.1 A at about 4.0 volts (point 182 on graph 174) without being damaged. Beyond that point, however, the leakage current 176 jumps several orders of magnitude from roughly 5.E-08 A to roughly 5.E-03 A (point 184 on graph 176), which indicates that the ESD device 100 is damaged.

Advantageously, ESD device 100 can conduct up to 2.0 A or higher before it is damaged. Additionally, without the need for a ballast resistor (such as prior art ballast resistor 72) there is little need for a silicide-free portion the drain 106 and the ESD device 100 can be more easily scaled compared to that of prior art ESD devices.

Also advantageously, the snap-back holding voltage is low compared to the initial avalanche breakdown, which means that the power dissipated by ESD device 100 during the ESD event is relatively low compared to prior art ESD devices such as ESD device 12. By way of comparison, at a maximum operating current of about 0.7 A (point 84 on FIG. 4) for the prior art device 12, the power dissipated is about 3.4 watts. Whereas, at 0.7 A operating current for ESD device 100 (point 186 on graph 174), the power dissipated is about 1.5 watts, or less than half that of the prior art device.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. An electrostatic discharge (ESD) device for an integrated circuit comprising:
    a substrate having a longitudinally extending fin dispose thereon;

a first n-type FinFET (NFET) disposed within the fin, the NFET including an n-type source, an n-type drain and a p-well disposed within the substrate under the source and drain; and a p-type FinFET (PFET) disposed within the fin, the PFET including a p-type source/drain region and an n-well disposed within the substrate under the source/drain region, the n-well and p-well located proximate enough to each other to form an np junction therebetween;

wherein the p-type source/drain region of the PFET and the n-type drain of the NFET are electrically connected to a common input node.

2. The ESD device of claim 1 wherein the n-type source and the p-well are electrically connected to an electrical ground of the integrated circuit through a common ground node.

3. The ESD device of claim 1 wherein the input node is connected to one of an input cell, an output cell and a power supply of the integrated circuit.

4. The ESD device of claim 1 wherein the NFET and PFET are electrically connected to operate as a silicon-controlled rectifier (SCR) in parallel with an NPN transistor when an ESD event is conducted through the input node.

5. The ESD device of claim 1 comprising a first PNP transistor, the first PNP transistor including:
   an emitter formed from the p-type source/drain region;
   a base formed from the n-well; and
   a collector formed from the p-well.

6. The ESD device of claim 1 comprising a first NPN transistor, the first NPN transistor including:
   a collector formed from the n-well;
   a base formed from the p-well; and
   an emitter formed from the n-type source.

7. The ESD device of claim 1 comprising a second NPN transistor, the second NPN transistor including:
   a base formed from the p-well;
   a collector formed from the n-type drain; and
   an emitter formed from the n-type source.

8. The ESD device of claim 1 comprising:
   an SCR including:
      a first PNP transistor including:
         an emitter formed from the p-type source/drain region,
         a base formed from the n-well, and
         a collector formed from the p-well; and
      a first NPN transistor including:
         a collector formed from the n-well;
         a base formed from the p-well; and
         an emitter formed from the n-type source; and
   a second NPN transistor including:
      a base formed from the p-well;
      a collector formed from the n-type drain; and
      an emitter formed from the n-type source.

9. The ESD device of claim 8 wherein:
   the base of the first PNP transistor is electrically connected to the collector of the first NPN transistor at the n-well;
   the base of the first NPN transistor, the collector of the first PNP transistor and the base of the second NPN transistor are electrically connected together at the p-well; and
   the emitters of the first and second NPN transistors are electrically connected together at the n-type source.

10. The ESD device of claim 9 wherein the SCR and the second NPN transistor are electrically connected in parallel between the input node and the ground node.

11. The ESD device of claim 10 comprising a substrate resistor formed from an inherent resistivity of the substrate, the substrate resistor electrically connected between the base of the first NPN and the ground node.

12. An ESD device for an integrated circuit comprising:
   a substrate;
   an n-type source, an n-type drain and a p-well disposed within the substrate, the p-well located under the source and drain; and
   a p-type source/drain region and an n-well disposed within the substrate, the n-well located under the source/drain region, the n-well and p-well located proximate enough to each other to form an np junction therebetween;
   wherein the p-type source/drain region and the n-type drain are electrically connected to a common input node; and
   wherein the n-type source and the p-well are electrically connected to an electrical ground through a common ground node.

13. The ESD device of claim 12 comprising:
   an SCR including:
      a first PNP transistor including:
         an emitter formed from the p-type source/drain region,
         a base formed from the n-well, and
         a collector formed from the p-well; and
      a first NPN transistor including:
         a collector formed from the n-well;
         a base formed from the p-well; and
         an emitter formed from the n-type source;
   a second NPN transistor including:
      a base formed from the p-well;
      a collector formed from the n-type drain; and
      an emitter formed from the n-type source.

14. The ESD device of claim 13 wherein:
   the base of the first PNP transistor is electrically connected to the collector of the first NPN transistor at the n-well;
   the base of the first NPN transistor, the collector of the first PNP transistor and the base of the second NPN transistor are electrically connected together at the p-well; and
   the emitters of the first and second NPN transistors are electrically connected together at the n-type source.

15. The ESD device of claim 13 wherein the SCR and the second NPN transistor are electrically connected in parallel between the input node and the ground node.

16. The ESD device of claim 13 comprising a substrate resistor formed from an inherent resistivity of the substrate, the substrate resistor electrically connected between the base of the first NPN and the ground node.

17. The ESD device of claim 13 wherein, when an ESD event is conducted through the input node, an avalanche breakdown is initiated from collector to base of the second NPN transistor within an ESD voltage range of between 3.5 and 5 volts across the ESD device.

18. The ESD device of claim 17 wherein, when avalanche breakdown is initiated from collector to base of the second NPN transistor, current is induced in both the bases of the first and second NPN transistors to allow the SCR to conduct and to drop the ESD voltage across the ESD device to within a range of 1.2 volts to 2.5 volts when the ESD device is conducting 0.5 amps or less of ESD current.

19. The ESD device of claim 18 wherein a voltage drop across a substrate resistance connected between the base of the first NPN transistor and the ground node latches the SCR on for the duration of the ESD event.

20. The ESD device of claim 19 wherein the ESD device can conduct up to 2 amps of ESD current without being damaged.

\* \* \* \* \*